(12) United States Patent
Chang et al.

(10) Patent No.: US 8,519,488 B2
(45) Date of Patent: Aug. 27, 2013

(54) III-V METAL-OXIDE-SEMICONDUCTOR DEVICE

(71) Applicant: National Chiao Tung University, Hsinchu (TW)

(72) Inventors: Edward Yi Chang, Hsinchu County (TW); Yueh-Chin Lin, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/757,861

(22) Filed: Feb. 4, 2013

(65) Prior Publication Data

US 2013/0140647 A1  Jun. 6, 2013

Related U.S. Application Data

(63) Continuation-in-part of application No. 12/849,025, filed on Aug. 3, 2010.

(51) Int. Cl.
*H01L 21/02* (2006.01)

(52) U.S. Cl.
USPC ........... 257/411; 257/324; 257/325; 257/410; 257/E29.042; 257/E29.17

(58) Field of Classification Search
USPC ................ 257/324, 325, E29.042, E29.17
See application file for complete search history.

(56) References Cited

U.S. PATENT DOCUMENTS

| | | | |
|---|---|---|---|
| 7,692,224 B2 * | 4/2010 | Droopad et al. | 257/288 |
| 2002/0173130 A1 * | 11/2002 | Pomerede et al. | 438/592 |
| 2010/0224935 A1 * | 9/2010 | Ono | 257/368 |
| 2010/0276668 A1 * | 11/2010 | Ko et al. | 257/24 |
| 2011/0266595 A1 * | 11/2011 | Hata | 257/190 |
| 2012/0032227 A1 * | 2/2012 | Seabaugh et al. | 257/105 |

OTHER PUBLICATIONS

L Yan, L B Kong, Q Li and C K Ong, "Amorphous $(CeO_2)_{0.67}(Al_2O_3)_{0.33}$ high-k gate dielectric thin films on silicon" Semicond. Sci. Technol. 18 (2003) L39-L41.

* cited by examiner

*Primary Examiner* — Eduardo A Rodela
(74) *Attorney, Agent, or Firm* — CKC & Partners Co., Ltd.

(57) ABSTRACT

A hafnium oxide layer, between a III-V semiconductor layer and a metal oxide layer is used to prevent interaction between the III-V semiconductor layer and the metal oxide layer.

2 Claims, 10 Drawing Sheets

III-V METAL-OXIDE-SEMICONDUCTOR DEVICE

CROSS-REFERENCE TO RELATED APPLICATION

This application is a continuation-in-part of U.S. application Ser. No. 12/849,025, filed Aug. 3, 2010, currently pending, which is herein incorporated by reference.

BACKGROUND

1. Technical Field

The disclosure relates to a structure of metal-oxide-semiconductor. More particularly, the disclosure relates to a structure of III-V metal-oxide-semiconductor.

2. Description of Related Art

III-V metal-oxide-semiconductor field effect transistors (MOSFETs) have been widely investigated in recent years. $In_xGa_{1-x}As$ material has high electron mobility and the $In_xGa_{1-x}As$ based devices have lower turn on voltage than conventional Si devices. Therefore, $In_xGa_{1-x}As$ material is considered as a potential candidate to replace Si as the channel material for next generation low power, high speed complementary metal-oxide-semiconductor (CMOS) device for logic applications.

High k materials such as $Al_2O_3$, $Ga_2O_3$, $Gd_2O_3$, $ZrO_2$ and $HfO_2$, were investigated as gate oxides for III-V MOS capacitors. The interface properties of high-k dielectric/$In_xGa_{1-x}As$ MOS devices were studied using different surface treatments and even with an inserted Ge or Si thin layers. Recently, the $HfO_2/Al_2O_3$ composite oxide structure was also studied (T. Yang, Y. Xuan, D. Zemlyanov, T. Shen, Y. Q. Wu, J. M. Woodall, and P. D. Ye: Appl. Phys. Lett., 91 (2007) 142122). However, to find a suitable oxide layer that has a really high dielectric constant and really low current leakage for III-V semiconductor is still a difficult task.

SUMMARY

In one aspect, the present invention is directed to a III-V metal-oxide-semiconductor (MOS) device having a high dielectric constant and low current leakage.

The III-V MOS device sequentially comprises a III-V semiconductor layer, a hafnium oxide layer, a first metal oxide layer with a high dielectric constant (more than 25), and a metal gate on a substrate. The hafnium oxide layer is in direct contact with the III-V semiconductor layer to form an interfacial layer with the III-V semiconductor layer, such that the hafnium oxide layer can suppress the out-diffusion of the III-V semiconductor layer into the first metal oxide layer to take the advantages of the high dielectric constant of first metal oxide layer.

According to an embodiment, the first metal oxide layer can be a lanthanum oxide layer, a cerium oxide layer, or a praseodymium oxide layer, for example.

According to another embodiment, the III-V MOS device further comprises a second metal oxide layer with a wide band gap (more than 6 eV) on the first metal oxide layer to decrease current leakage. For example, the first metal oxide layer is cerium oxide layer, and the second metal oxide layer is aluminum oxide layer.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later. Many of the attendant features will be more readily appreciated as the same becomes better understood by reference to the following detailed description considered in connection with the accompanying drawings.

DETAILED DESCRIPTION

Figure 1:
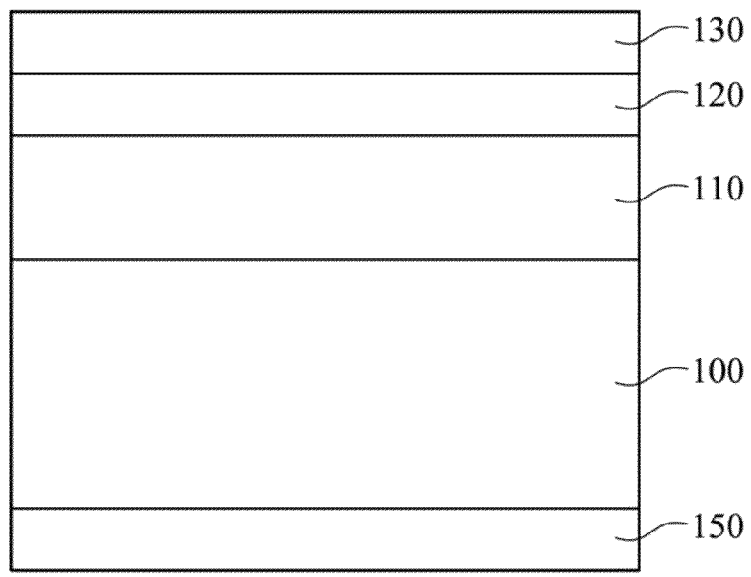
FIG. 1 is a cross-sectional diagram of a MOS capacitor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Generally, a C-V curve of a MOS capacitor can be divided into three regions. When the applied gate voltage is negative, the MOS capacitor is in the inversion region. In the inversion region, if the capacity of the MOS capacitor is higher, more charge carrier will be generated in the MOS FET. When the applied gate voltage is positive, the MOS capacitor is in the accumulation region. In the accumulation region, if the capacity of the MOS capacitor is higher, the oxide layer of the MOS capacitor has a higher dielectric constant. When the applied gate voltage is about zero, the MOS capacitor is in the depletion region.

Some MOS capacitors were fabricated to measure the C-V curves thereof. FIG. 1 is a cross-sectional diagram of a MOS capacitor. In FIG. 1, a III-V semiconductor layer 210, a metal oxide layer 220, and a gate 230 are sequentially disposed on a substrate 200. In addition, a back metal layer 250 can be further disposed below the substrate 200. The III-V semiconductor layer 210 above can be an InAs layer or an $In_xGa_{1-x}As$ layer, for example, and can be formed by epitaxial deposition.

The metal oxide layer 220 above can be a single layer made from a single metal oxide, or a composite layer made from at least two metal oxides.

Embodiment 1

$La_2O_3/HfO_2$—InGaAs MOS Capacitor

In this embodiment, three $La_2O_3/HfO_2$—InGaAs MOS capacitors were fabricated, and each layer in the structure of the $La_2O_3/HfO_2$—InGaAs MOS capacitors is listed in Table 1 below. Two comparative examples, i.e. $HfO_2$—InGaAs MOS capacitor and $La_2O_3$—InGaAs MOS capacitor were also fabricated, and each layer in the comparative MOS capacitors is also listed in Table 1 below. In this embodiment, the post deposition annealing (PDA) is performed at 500° C. in forming gas (3% $H_2$ and 97% $N_2$).

TABLE 1

Each layer in the MOS capacitors

| MOS capacitor | Examples | | | Comparative Examples | |
|---|---|---|---|---|---|
|  | 1 | 2 | 3 | 1 | 2 |
| Gate | Al (50 nm) | | | | |
| $La_2O_3$ layer | 8 nm | 7 nm | 6 nm | — | 12 nm |
| $HfO_2$ layer | 1 nm | 2 nm | 3 nm | 9 nm | — |
| III-V Semiconductor layer | n-$In_{0.53}Ga_{0.47}As$ (100 nm) Dopant Si: $5 \times 10^{17}$ cm$^{-3}$ | | | | |
| Substrate | n$^+$-InP | | | | |
| Back metal | Al (50 nm) | | | | |
| PDA (° C.) | 500 | 500 | 500 | 500 | 500 |

Figure 2:
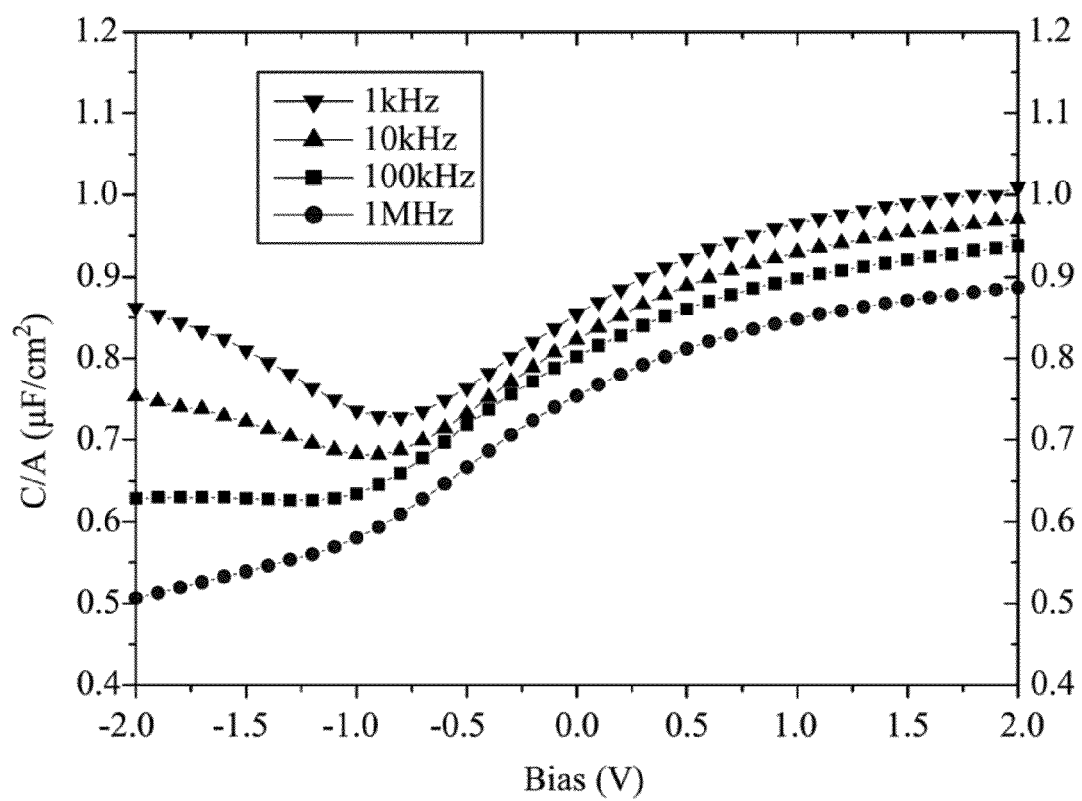
FIG. 2 is a diagram of C-V curves of 9 nm $HfO_2$—InGaAs MOS capacitor under various operation frequencies.
Figure 3A:
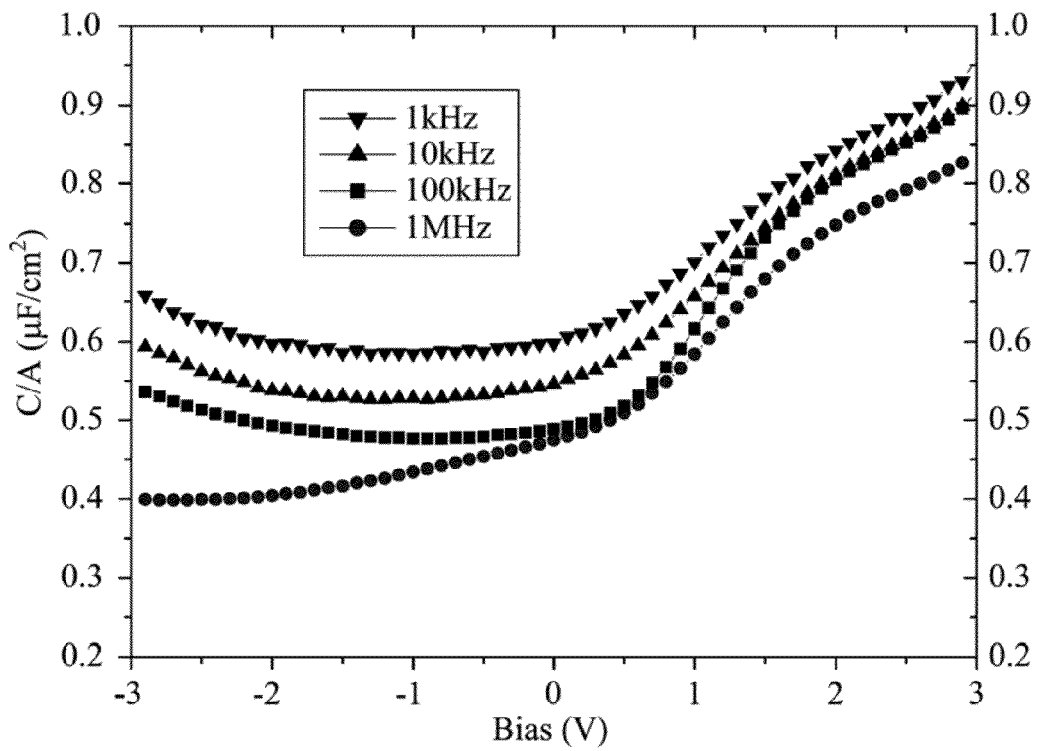
FIG. 3A is a diagram of C-V curves of 12 nm $La_2O_3$—InGaAs MOS capacitor under various operation frequencies.

The C-V curves of the comparative examples 1 and 2 under various operation frequencies were respectively shown in FIGS. 2 and 3A. Comparing FIGS. 2 and 3A, the $La_2O_3$—InGaAs MOS capacitor has greater capacitance, since lanthanum oxide has greater dielectric constant (30) than hafnium oxide (25). However, for the $La_2O_3$—InGaAs MOS capacitor, a larger dispersion in capacitance and lack of strong inversion in the inversion region were observed. Therefore, it showed that the $La_2O_3$—InGaAs MOS capacitor was eclectically failed.

Figure 3B:
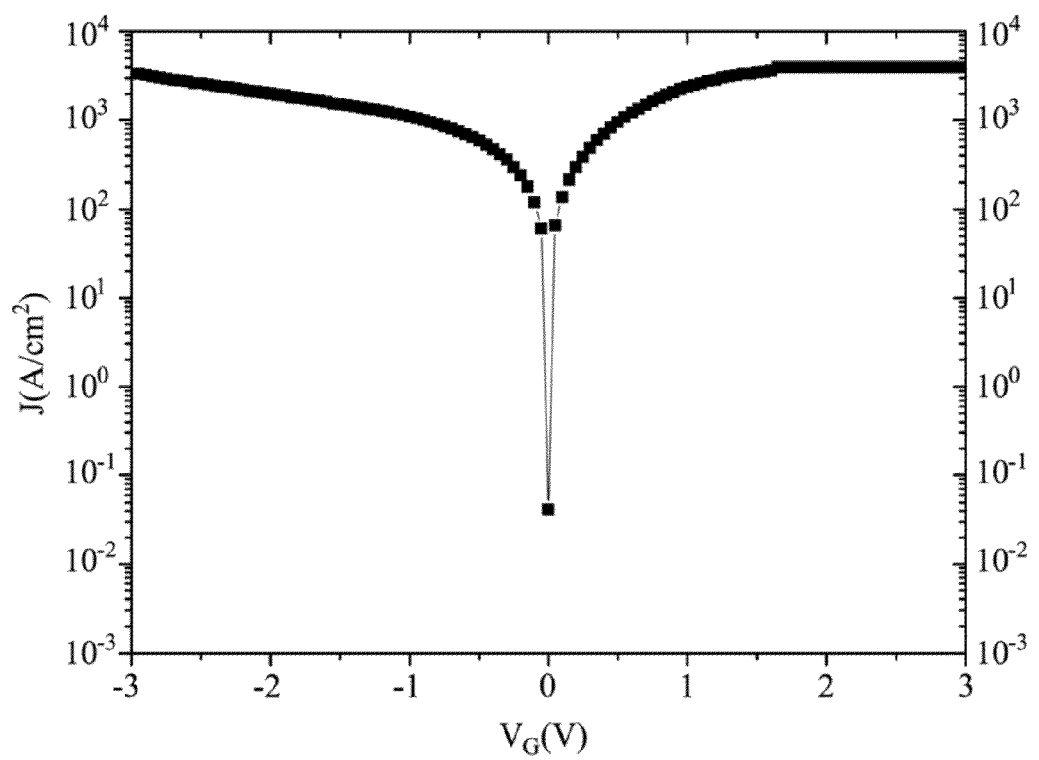
FIG. 3B is a diagram of J-V curve of 12 nm $La_2O_3$—InGaAs MOS capacitor.

The J-V curve of the $La_2O_3$—InGaAs MOS capacitor above is shown in FIG. 3B. In FIG. 3B, a large gate leakage current (more than 1000 A/cm$^2$) in the investigated range of the applied gate voltage was observed. Accordingly, it seems that some interaction was existed between the lanthanum oxide and $In_{0.53}Ga_{0.47}As$. In the photographs of tunneling electron microscopy (TEM) and the results of energy dispersive X-ray (EDX) spectrum, it was found that $In_{0.53}Ga_{0.47}As$ diffused into the lanthanum oxide layer, and thus the MOS capacitor failed.

Figure 4A:
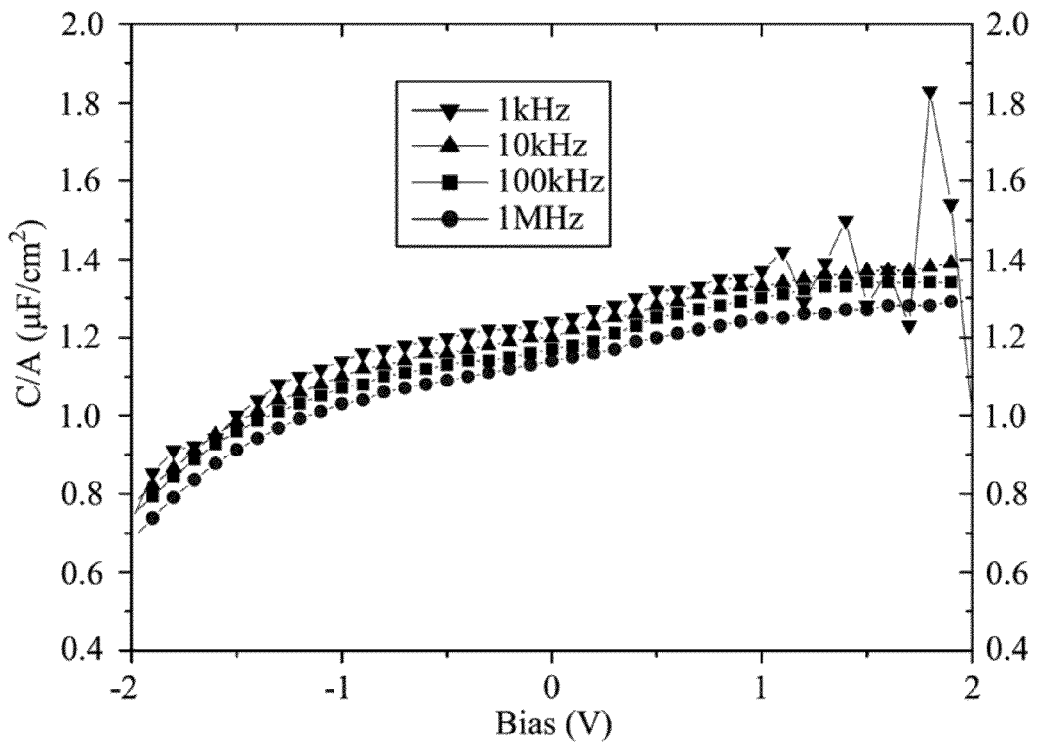
FIGS. 4A-4C are diagrams of C-V curves of 8 nm $La_2O_3$/1 nm $HfO_2$—$In_{0.53}Ga_{0.47}As$, 7 nm $La_2O_3$/2 nm $HfO_2$—$In_{0.53}Ga_{0.47}As$, and 6 nm $La_2O_3$/3 nm $HfO_2$—$In_{0.53}Ga_{0.47}As$ MOS capacitors under various operation frequencies, respectively.
Figure 4B:
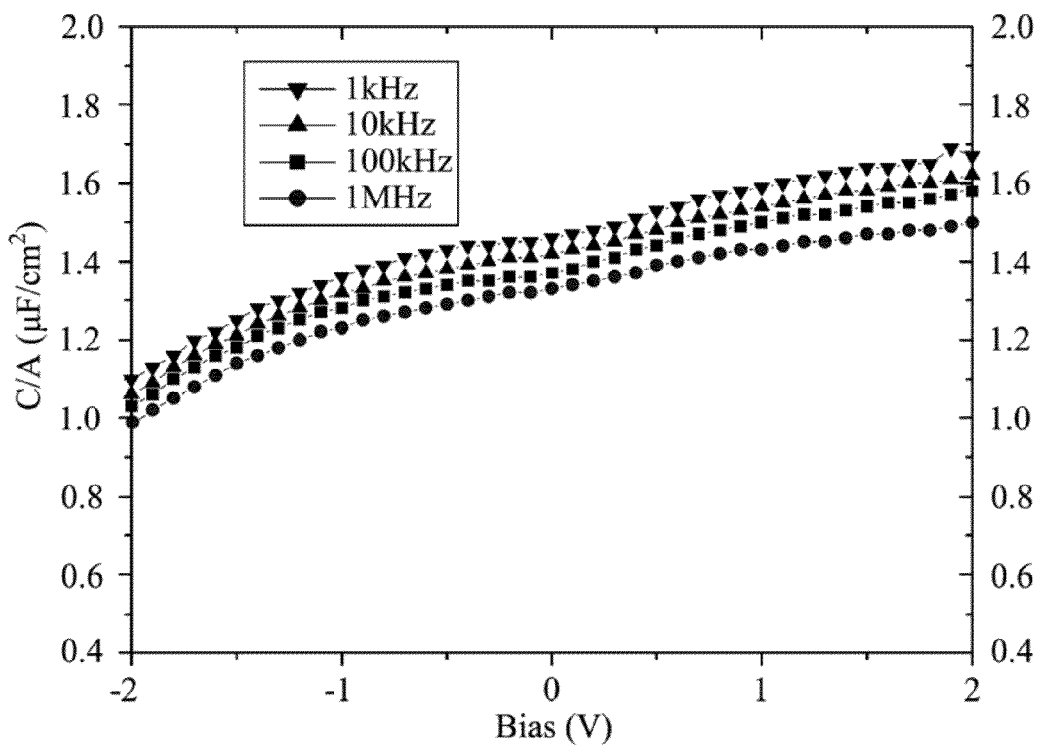
Figure 4C:
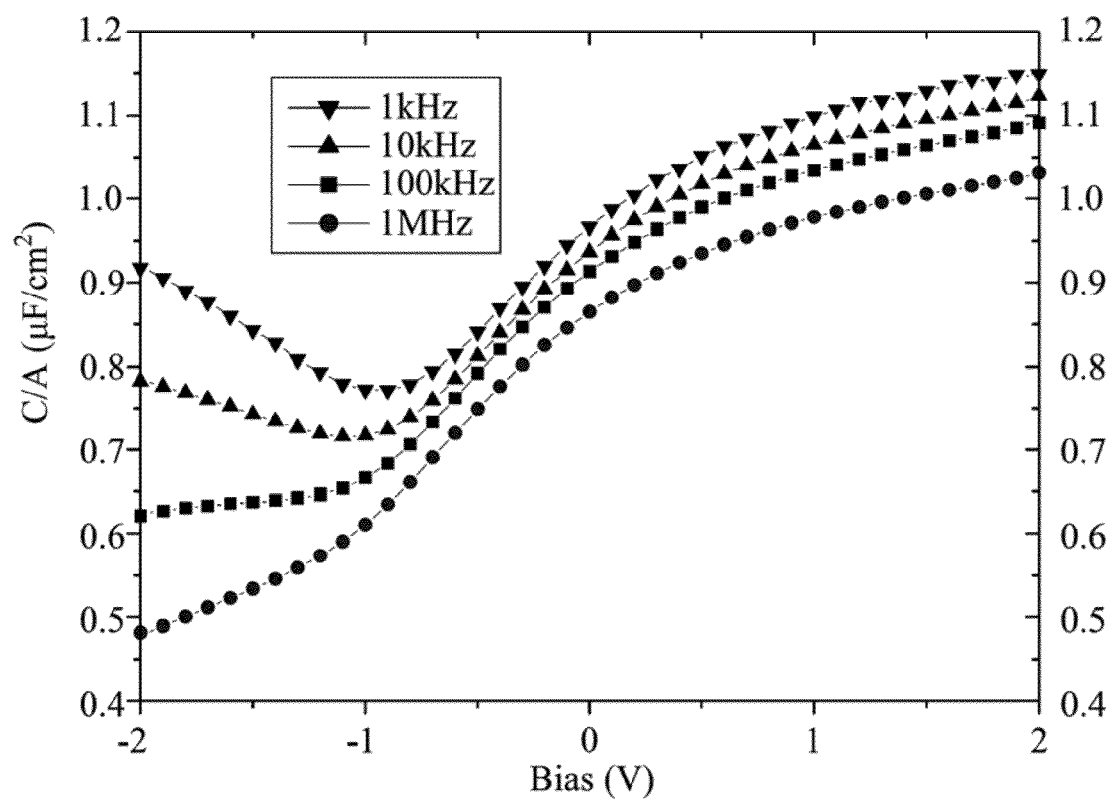

The C-V curves of examples 1-3 under various operation frequencies are respectively shown in FIGS. 4A-4C. FIGS. 4A and 4B do not show the strong inversion in the inversion region. Therefore, it showed that the 1 nm or 2 nm hafnium oxide layer could not successfully stop the $In_{0.53}Ga_{0.47}As$ layer diffusing into the lanthanum oxide layer. Since a thin film with relatively low resistivity is often formed between a III-V semiconductor layer and an oxide layer, large frequency dispersion in the C-V curves is usually observed. However, in FIG. 2C, the frequency dispersion of the C-V curves is quite small. It showed that the 3 nm hafnium oxide layer can successfully inhibit the formation of the thin film between the $In_{0.53}Ga_{0.47}As$ layer and the lanthanum oxide layer.

Embodiment 2

$CeO_2/HfO_2$—InGaAs and $Al_2O_3/CeO_2/HfO_2$—InGaAs MOS Capacitors

In this embodiment, two $CeO_2/HfO_2$—InGaAs MOS capacitors and one $Al_2O_3/CeO_2/HfO_2$—InGaAs MOS capacitor were fabricated, and each layer in the structures of the $CeO_2/HfO_2$—InGaAs and $Al_2O_3/CeO_2/HfO_2$—InGaAs MOS capacitors is listed in Table 2 below. Two comparative examples, i.e. $HfO_2$—InGaAs MOS capacitor and $CeO_2$—InGaAs MOS capacitor were also fabricated, and each layer in the comparative MOS capacitors is also listed in Table 2 below. The post deposition annealing (PDA) of each samples are also listed in Table 2 below.

TABLE 2

Each layer in the MOS capacitors

| MOS capacitor | Examples | | | Comparative Examples | |
|---|---|---|---|---|---|
|  | 4 | 5 | 6 | 3 | 4 |
| Gate | Au/Ni | | | | |
| $Al_2O_3$ layer | — | — | 4 nm | — | — |
| $CeO_2$ layer | 6 nm | 5 nm | 5 nm | — | 9 nm |
| $HfO_2$ layer | 3 nm | 1 nm | 1 nm | 10 nm | — |
| III-V Semiconductor layer | n-$In_{0.7}Ga_{0.3}As$ | n-$In_{0.53}Ga_{0.47}As$ (100 nm) Dopant Si: $5 \times 10^{17}$ cm$^{-3}$ | | | n-$In_{0.7}Ga_{0.3}As$ |
| Substrate | n$^+$-InP | | | | |
| Back metal | Au/Ge/Ni/Au | | | | |
| PDA (° C.) | 500 | 400 | 400 | 500 | 500 |

Figure 5A:
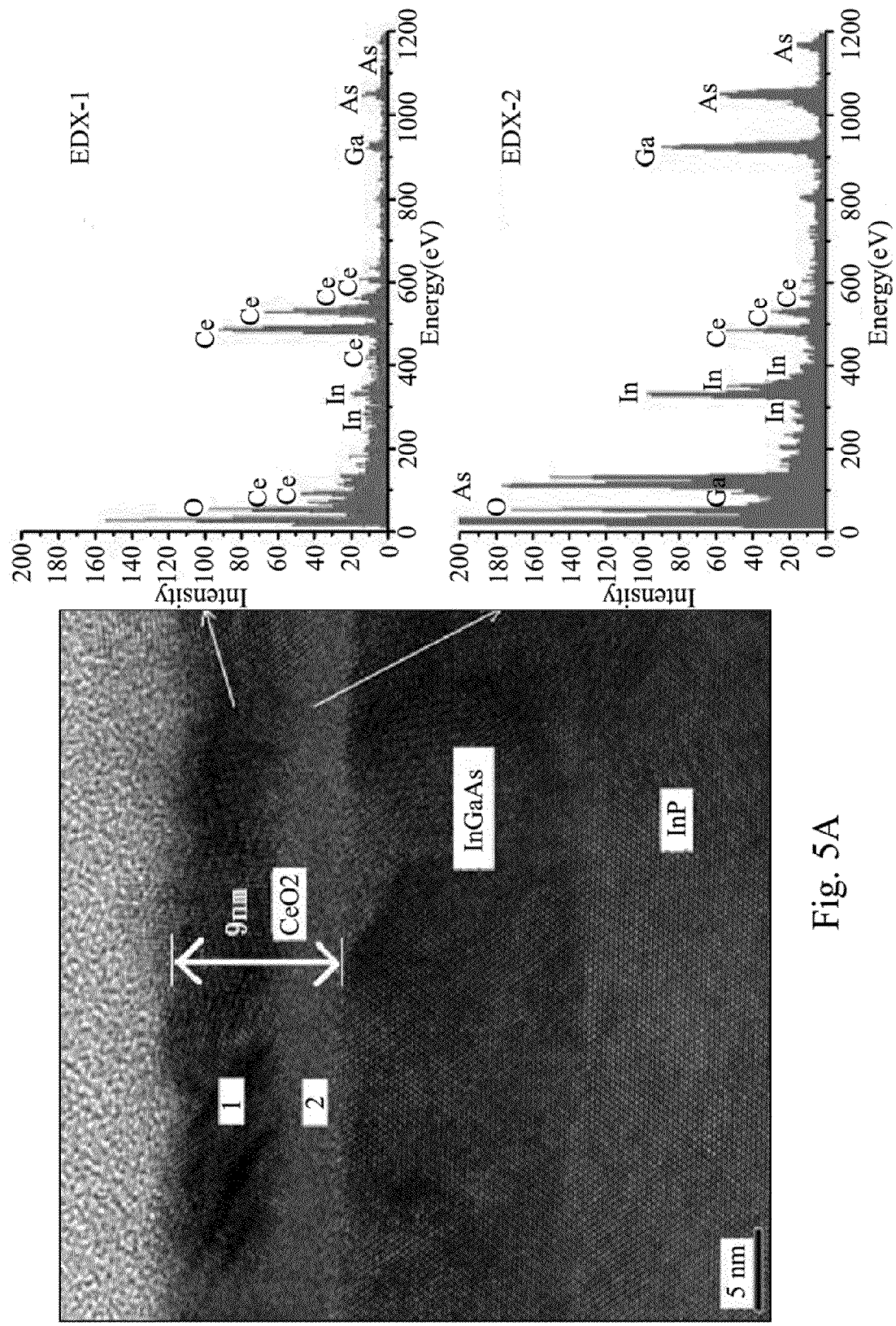
FIGS. 5A-5C are photographs of tunneling electron microscopy (TEM) and the results of energy dispersive X-ray (EDX) spectrum of 9 nm $CeO_2$—$In_{0.7}Ga_{0.3}As$ MOS capacitor, 6 nm $CeO_2$/3 nm $HfO_2$—$In_{0.7}Ga_{0.3}As$ MOS capacitor, and 4 nm $Al_2O_3$/5 nm $CeO_2$/1 nm $HfO_2$—$In_{0.53}Ga_{0.47}$ MOS capacitor, respectively.
Figure 5B:
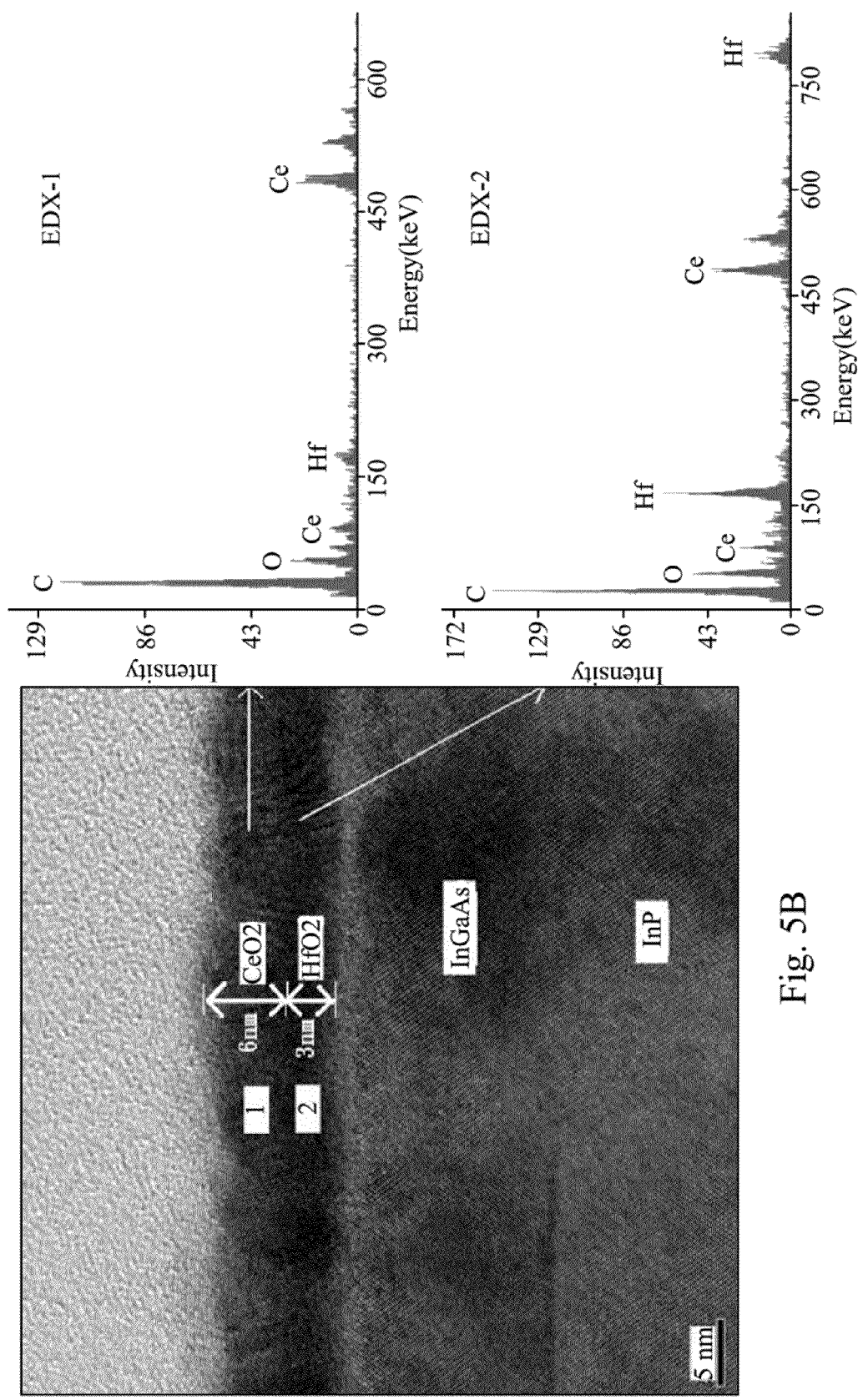
Figure 5C:
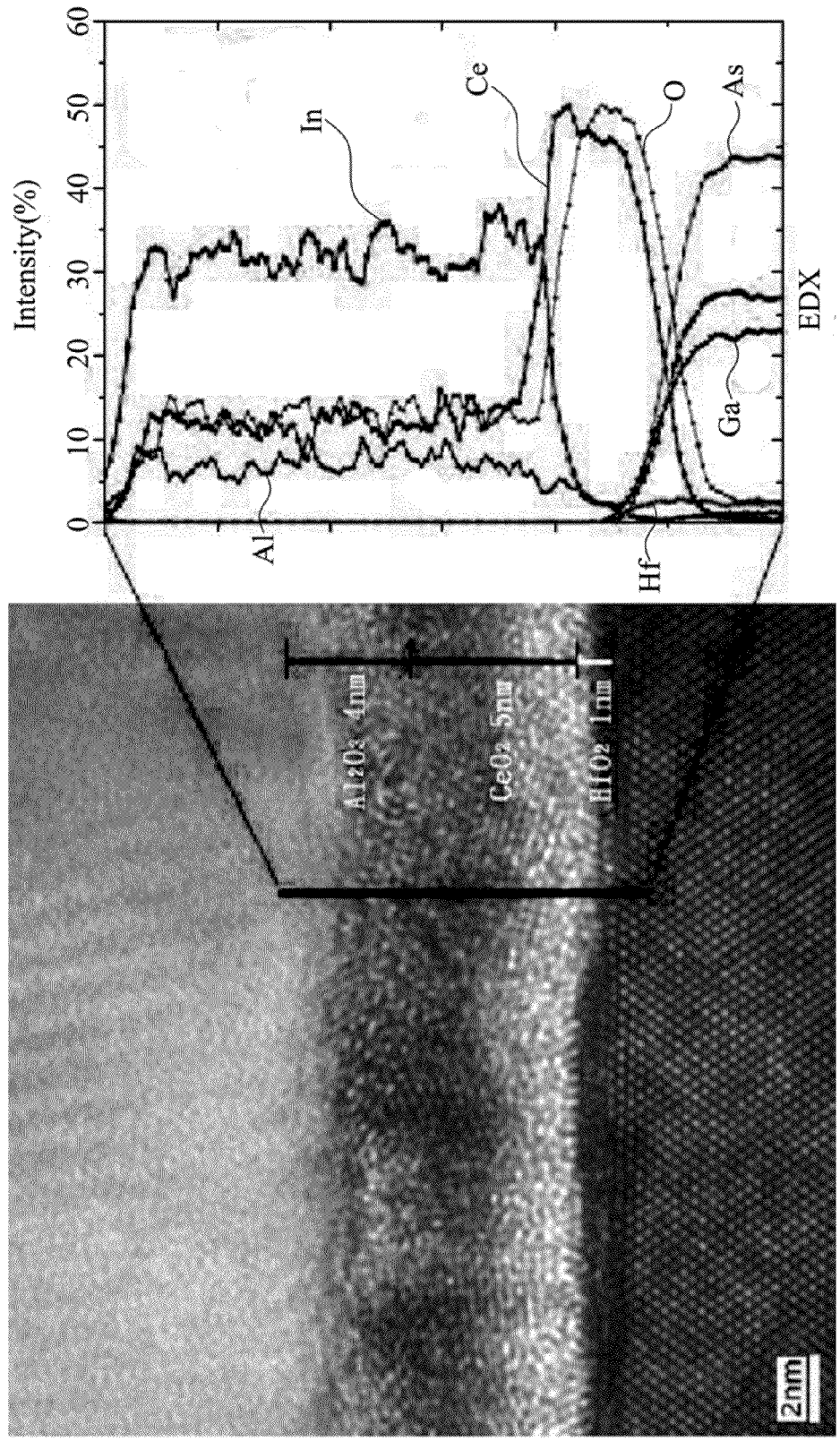

FIGS. 5A-5C are photographs of tunneling electron microscopy (TEM) and energy dispersive X-ray (EDX) spectrum of the comparative example 4 and the examples 4 and 6, respectively. In FIG. 5A (comparative example 4), it can be clearly seen that In, Ga, and As diffused into the cerium oxide layer to form oxides of In, Ga, and As when cerium oxide layer directly contacted the $In_{0.7}Ga_{0.3}As$ layer. This phenomenon led to the MOS capacitor having higher leakage current. In addition, surface pinning, and irregular and uneven interface between $CeO_2$ layer and $In_{0.7}Ga_{0.3}As$ layer were also observed.

However, in FIG. 5B (example 4), it can be observed that the insertion of the 3 nm hafnium oxide layer between the cerium oxide layer and the $In_{0.7}Ga_{0.3}As$ layer could successfully stop the diffusion of In, Ga, and As into the cerium oxide layer. In light of example 4, an interfacial layer can be formed at the interface of a $HfO_2$ layer and an InGaAs layer to suppress the out-diffusion of In, Ga and As into a $CeO_2$ layer. In FIG. 5C (example 6), it can be seen that hafnium oxide layer with 1 nm thick was sufficient to suppress the out-diffusion of Ga and As into a $CeO_2$ layer. Therefore, the leakage current of the MOS capacitors can be decreased, and the operation voltage and capacitance of the MOS capacitors can be increased.

Figure 6A:
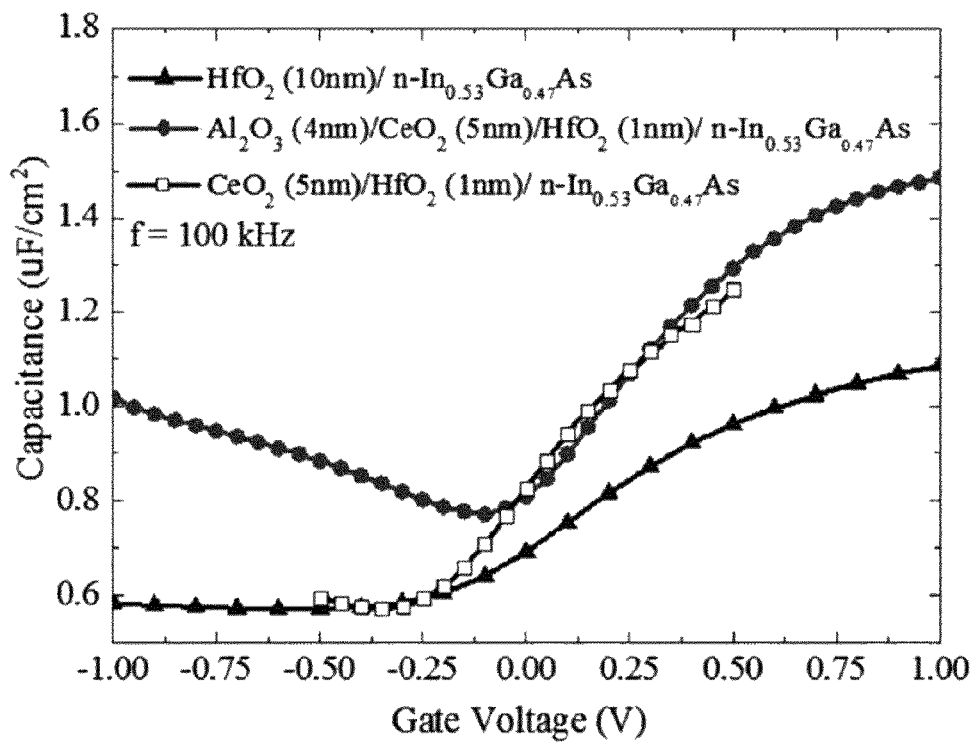
FIGS. 6A and 6B are diagrams of C-V curves and leakage current curves at 100 kHz of 4 nm $Al_2O_3$/5 nm $CeO_2$/1 nm $HfO_2$—$In_{0.53}Ga_{0.47}As$, 5 nm $CeO_2$/1 nm $HfO_2$—$In_{0.53}Ga_{0.47}As$, and 10 nm $HfO_2$—$In_{0.53}Ga_{0.47}As$ capacitors, respectively.
Figure 6B:
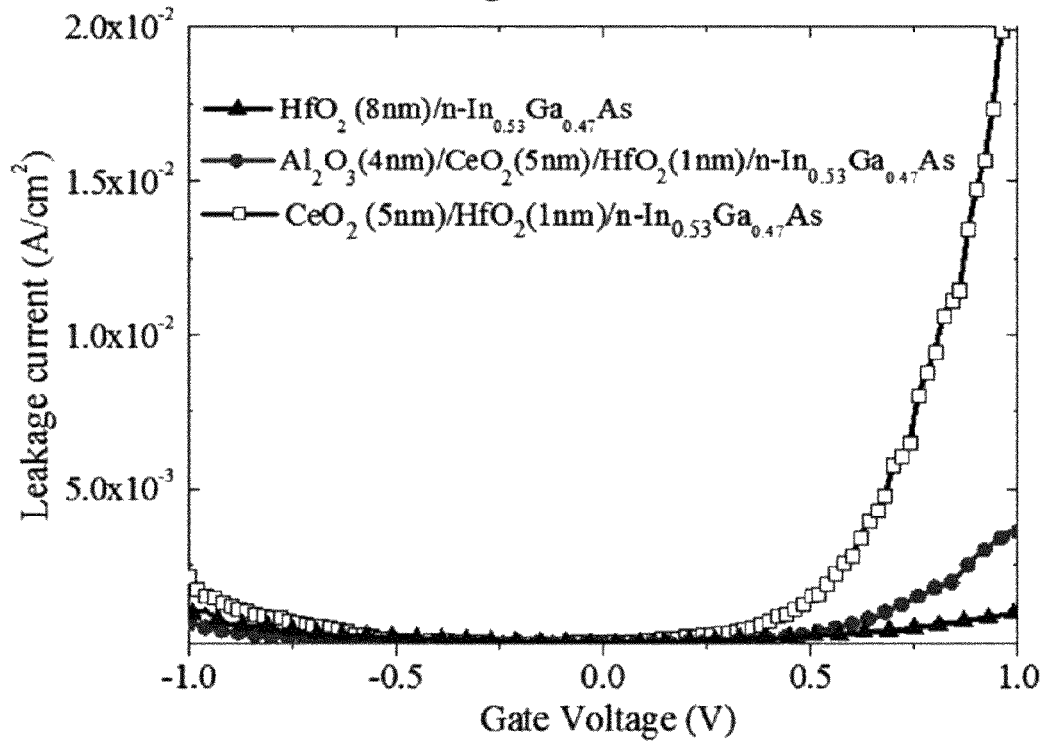

FIGS. 6A and 6B are diagrams of C-V curves at 100 kHz and leakage current curves of samples 5-6 and comparative sample 3, respectively. Comparing the capacitances of example 5 (□) and comparative example 3 (▲) in FIG. 6A, it can be observed that the capacitance of the comparative example 3 was enhanced due to the incorporation of high k material of $CeO_2$ layer in the example 5. However, comparing the leakage current of example 5 (□) and comparative example 3 (▲) in FIG. 6B, the leakage current of comparative example 3 was also increased due to the lower energy band gap of $CeO_2$ (3.2 eV) incorporated in the example 5.

Therefore, an aluminum oxide layer with higher band gap value (6.65 eV) was stacked on the cerium oxide layer in example 6 (●). Comparing the capacitances of the examples 5 and 6 in FIG. 6A, it can be observed that the capacitance of the example 6 was still close to the example 5, although the dielectric constant of aluminum oxide (8-11.5) is much lower than the dielectric constant of cerium oxide (39). However, comparing the leakage current of the examples 5 and 6 in FIG. 6B, the leakage current had been greatly decreased.

Embodiment 3

$Pr_6O_{11}/HfO_2$—InGaAs MOS Capacitors

In this embodiment, a $Pr_6O_{11}/HfO_2$—InGaAs MOS capacitor was fabricated. Each layer of the $Pr_6O_{11}/HfO_2$—InGaAs MOS capacitor structure and post deposition annealing (PDA) temperature are listed in Table 3.

TABLE 3

| | Each layer in the MOS capacitors | |
|---|---|---|
| MOS capacitor | Example 7 | Comparative Example 5 |
| Gate | Au/Ni | |
| $Pr_6O_{11}$ layer | 5 nm | — |
| $HfO_2$ layer | 5 nm | 1 nm |
| III-V Semiconductor layer | n-$In_{0.53}Ga_{0.47}As$ (100 nm) Dopant Si: $5 \times 10^{17}$ cm$^{-3}$ | |
| Substrate | n$^+$-InP | |
| Back metal | Au/Ge/Ni/Au | |
| PDA (° C.) | 500 | |

Figure 7:
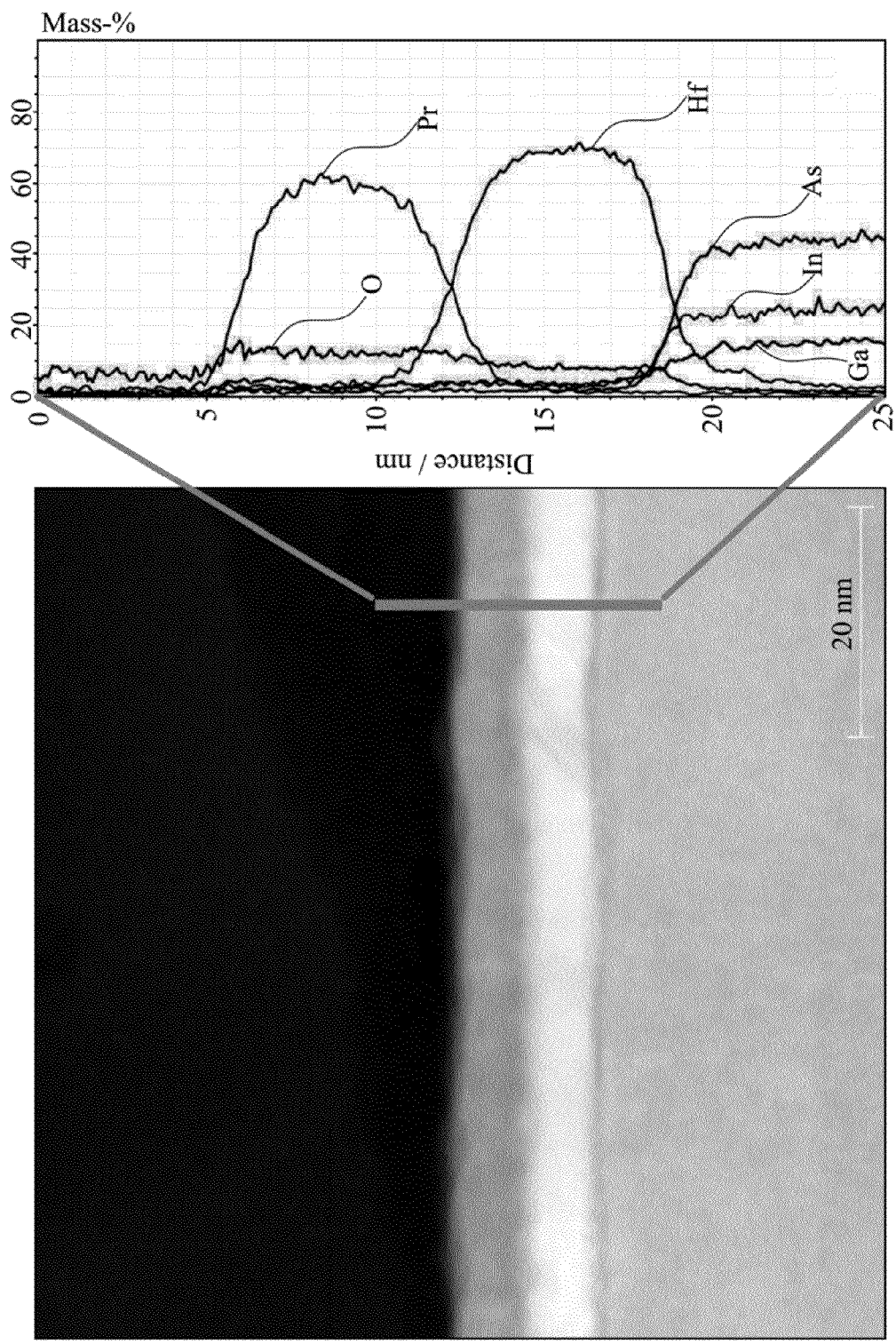
FIG. 7 is a photographs of tunneling electron microscopy (TEM) and energy dispersive X-ray (EDX) spectra of 5 nm $Pr_6O_{11}$/5 nm $HfO_2$—InGaAs MOS capacitor.

FIG. 7 is a photographs of tunneling electron microscopy (TEM) and energy dispersive X-ray (EDX) spectra of example 7. From FIG. 7, it can be known that 5 nm thick hafnium oxide can successfully suppress the out-diffusion of the In, Ga, and As into the praseodymium oxide layer.

Figure 8:
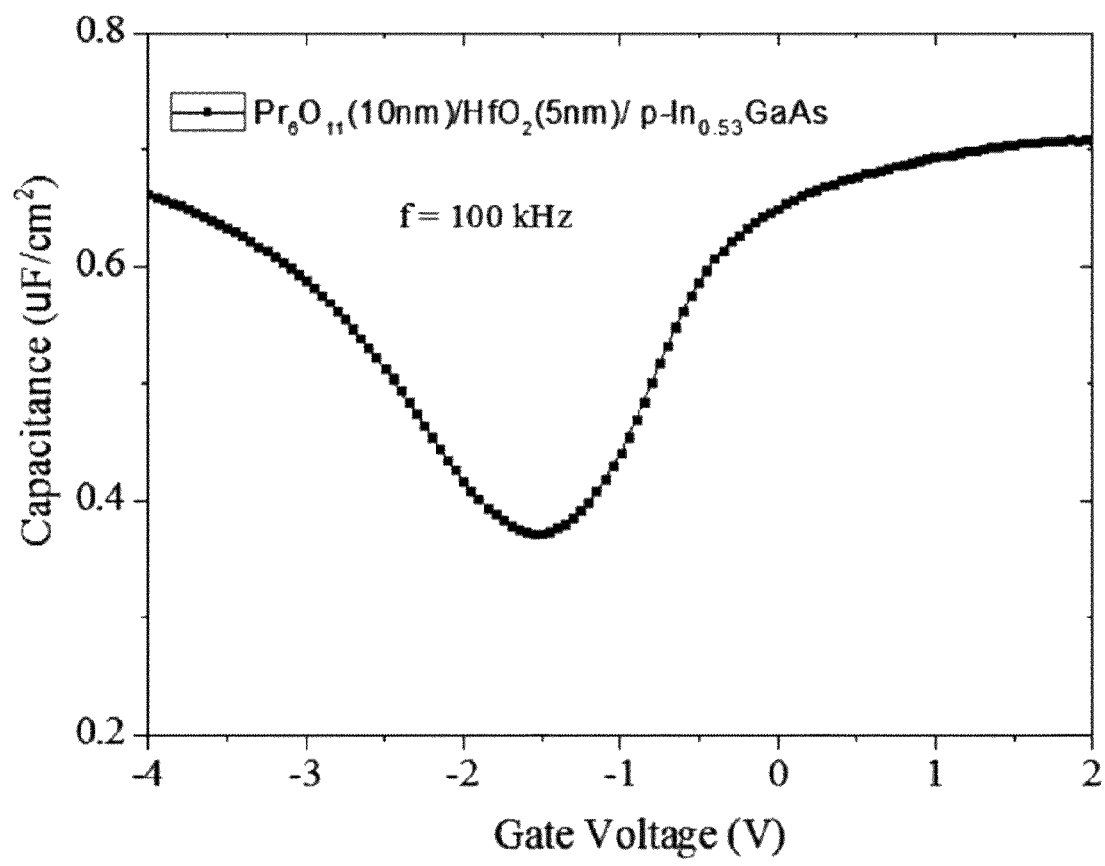
FIG. 8 is a diagram of a C-V curve at 100 kHz of 5 nm $Pr_6O_{11}$/5 nm $HfO_2$—InGaAs MOS capacitor

FIG. 8 is a diagram of a C-V curve at 100 kHz of Example 7. From FIG. 8, it can be known that since the 5 nm thick hafnium oxide can suppress the out-diffusion of the In, Ga, and As into the praseodymium oxide layer, the leakage current of the MOS capacitors can be decreased, and the operation voltage and capacitance of the MOS capacitors can be increased.

From the embodiments disclosed above, it can be known that an interfacial layer can be formed at the interface of a hafnium oxide layer and an InGaAs layer, and therefore a hafnium oxide with sufficient thickness can successfully suppress the out-diffusion of the In, Ga, and As into the metal oxide layer above the hafnium oxide layer. Accordingly, leakage current of MOS capacitors can be decreased, and operation voltage and capacitance of the MOS capacitors can be increased.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A III-V metal-oxide-semiconductor (MOS) device, comprising:
    a III-V semiconductor layer on a substrate;
    a hafnium oxide layer disposed on the III-V semiconductor layer to directly contact the III-V semiconductor layer, wherein the thickness of the hafnium oxide layer is at least 5 nm;
    a praseodymium oxide layer on the hafnium oxide layer; and
    a metal gate on the praseodymium layer.

2. The III-V MOS device of claim 1, wherein the III-V semiconductor layer is an InAs layer or an InGaAs layer.

* * * * *